(12) United States Patent
Masuda et al.

(10) Patent No.: US 8,659,358 B2
(45) Date of Patent: Feb. 25, 2014

(54) AMPLIFIER, TRANSMISSION APPARATUS, AND GATE VOLTAGE DETERMINATION METHOD

(75) Inventors: Keiji Masuda, Sendai (JP); Takumi Takayashiki, Sendai (JP)

(73) Assignee: Fujitsu Limited, Kawasaki (JP)

( * ) Notice: Subject to any disclaimer, the term of this patent is extended or adjusted under 35 U.S.C. 154(b) by 50 days.

(21) Appl. No.: 13/413,888

(22) Filed: Mar. 7, 2012

(65) Prior Publication Data

US 2012/0235748 A1    Sep. 20, 2012

(30) Foreign Application Priority Data

Mar. 18, 2011    (JP) ................. 2011-061769

(51) Int. Cl.
*H03G 3/10*    (2006.01)
(52) U.S. Cl.
USPC .......................... 330/285; 330/289
(58) Field of Classification Search
USPC .................. 330/289, 285, 296, 129, 136, 279
See application file for complete search history.

(56) References Cited

U.S. PATENT DOCUMENTS

| | | | |
|---|---|---|---|
| 6,677,823 B2 * | 1/2004 | Terosky et al. | 330/289 |
| 7,375,588 B2 * | 5/2008 | Yamakawa et al. | 330/289 |
| 7,656,233 B2 * | 2/2010 | Lee | 330/289 |
| 7,994,862 B1 * | 8/2011 | Pukhovski | 330/289 |
| 8,183,927 B2 * | 5/2012 | Mochizuki | 330/289 |
| 8,385,854 B2 * | 2/2013 | Hadjichristos et al. | 455/117 |
| 2007/0221994 A1 * | 9/2007 | Ishikawa et al. | 257/356 |
| 2010/0289585 A1 | 11/2010 | Tomisawa et al. | |

FOREIGN PATENT DOCUMENTS

| | | |
|---|---|---|
| JP | 2007-259576 | 10/2007 |
| JP | 2010-268393 | 11/2010 |

\* cited by examiner

*Primary Examiner* — Henry Choe
(74) *Attorney, Agent, or Firm* — Katten Muchin Rosenman LLP

(57) ABSTRACT

An amplifier includes a detector configured to detect a given value used for monitoring a change in a gain of an amplifying element amplifying a signal in response to a gate voltage applied to a gate terminal, and a controller configured to judge, based on the detected given value, whether or not the gate voltage is to be increased, and to determine the increased gate voltage in response to the given value when the controller judges that the gate voltage is to be increased.

17 Claims, 14 Drawing Sheets

| TEMPERATURE [°C] | GATE VOLTAGE [V] |
|---|---|
| 0 | -1.2 |
| -5 | -1.1875 |
| -10 | -1.175 |
| -15 | -1.1625 |
| -20 | -1.15 |
| -25 | -1.1375 |
| -30 | -1.125 |
| -35 | -1.1125 |
| -40 | -1.1 |
| ... | ... |

FIG. 7

| INPUT POWER [dBm] | GATE VOLTAGE [V] |
|---|---|
| 30 | -1.2 |
| 28 | -1.1875 |
| 26 | -1.175 |
| 24 | -1.1625 |
| 22 | -1.15 |
| 20 | -1.1375 |
| 18 | -1.125 |
| 16 | -1.1125 |
| 14 | -1.1 |
| ... | ... |

| DISTORTION COMPENSATION COEFFICIENT | GATE VOLTAGE [V] |
|---|---|
| 1 | -1.2 |
| 1.1 | -1.1875 |
| 1.2 | -1.175 |
| 1.3 | -1.1625 |
| 1.4 | -1.15 |
| 1.5 | -1.1375 |
| 1.6 | -1.125 |
| 1.7 | -1.1125 |
| 1.8 | -1.1 |
| ... | ... |

344

AMPLIFIER, TRANSMISSION APPARATUS, AND GATE VOLTAGE DETERMINATION METHOD

CROSS-REFERENCE TO RELATED APPLICATION

This application is based upon and claims the benefit of priority of the prior Japanese Patent Application No. 2011-061769, filed on Mar. 18, 2011, the entire contents of which are incorporated herein by reference.

FIELD

The embodiments discussed herein are related to an amplifier, a transmission apparatus, and a gate voltage determination method.

BACKGROUND

Transmission apparatuses such as a base station and the like, which transmit and receive signals, use amplifiers. The amplifiers use amplifying elements such as a field effect transistor (FET) and the like. The amplifying elements amplify signal in response to gate voltages applied to gate terminals. While currently, as such amplifiers, amplifiers such as an LDMOS-FET, a GaAs-FET, and the like have been used, recently there have been becoming more popular amplifiers utilizing highly-efficient gallium nitride (GaN)-FET devices capable of operating with lower power consumption than such amplifiers. Usually, an amplifier utilizing the GaN-FET device in this way amplifies a signal with the gate voltage of the GaN-FET device being fixed.

SUMMARY

According to an aspect of the invention, an amplifier includes a detector configured to detect a given value used for monitoring a change in a gain of an amplifying element amplifying a signal in response to a gate voltage applied to a gate terminal, and a controller configured to judge, based on the detected given value, whether or not the gate voltage is to be increased, and to determine the increased gate voltage in response to the given value when the controller judges that the gate voltage is to be increased.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a diagram illustrating an example of an optimum value storage;

FIG. 7 is a diagram illustrating an example of an optimum value storage;

FIG. 11 is a diagram illustrating an example of an optimum value storage;

DESCRIPTION OF EMBODIMENTS

Hereinafter, the embodiments of an amplifier, a transmission apparatus, and a gate voltage determination method, disclosed in the present technology, will be described in detail based on drawings.

While inventing the present embodiments, observations were made regarding a related art. Such observations include the following, for example.

In the amplifier utilizing the GaN-FET device of the related art, when, with the gate voltage being fixed, output power is controlled so as to change from a high output to a low output, there occurs an Idq drift that an idle current (Idq) becomes less than or equal to a specified value. When the Idq drift has occurred, the gain of the GaN-FET device measurably changes, and there may be a possibility that distortion compensation or the like is adversely affected. In particular, when the GaN-FET device is at a low temperature, the Idq drift measurably occurs. Accordingly, it is desirable to monitor the temperature of the GaN-FET device, so as to monitor the gain change occurring owing to the Idq drift.

For example, for monitoring the temperature of the GaN-FET device, there has existed a technique in which the temperature of the GaN-FET device is detected using a thermistor and the gate voltage of the GaN-FET device is controlled based on the detection result.

Here, in the technique, it may be hard to resolve the change in a gain, which occurs owing to the Idq drift.

For example, in the technique, the gate voltage of the GaN-FET device is linearly decreased with a decrease in the temperature of the GaN-FET device. Therefore, in the technique, not only at a low temperature at which the Idq drift measurably occurs, but also at a high temperature at which usually the Idq drift does not occur, the gate voltage of the GaN-FET device turns out to be continuously decreased, and hence the Idq is also decreased with an decrease in the gate voltage. As a result, there is a possibility that the Idq is decreased to a value less than or equal to the specified value to cause the Idq drift to occur and the gain of the GaN-FET device measurably changes.

Before the embodiments are described, the Idq drift of a GaN-FET device included in the amplifier will be described. For example, the Idq drift is a phenomenon that the idle current (Idq) of an initial setting in the GaN-FET device changes under various kinds of conditions. In addition, the idle current is a drain current in a state in which no signal is applied to the GaN-FET device.

As a condition in which the Idq drift occurs, when the rated output power of the amplifier is lowered from a high output to a low output, the Idq drift occurs. In particular, when the GaN-FET device is at a low temperature, such an Idq drift measurably occurs, and when the GaN-FET device is at a high temperature, the Idq drift does not occur.

Figure 1:
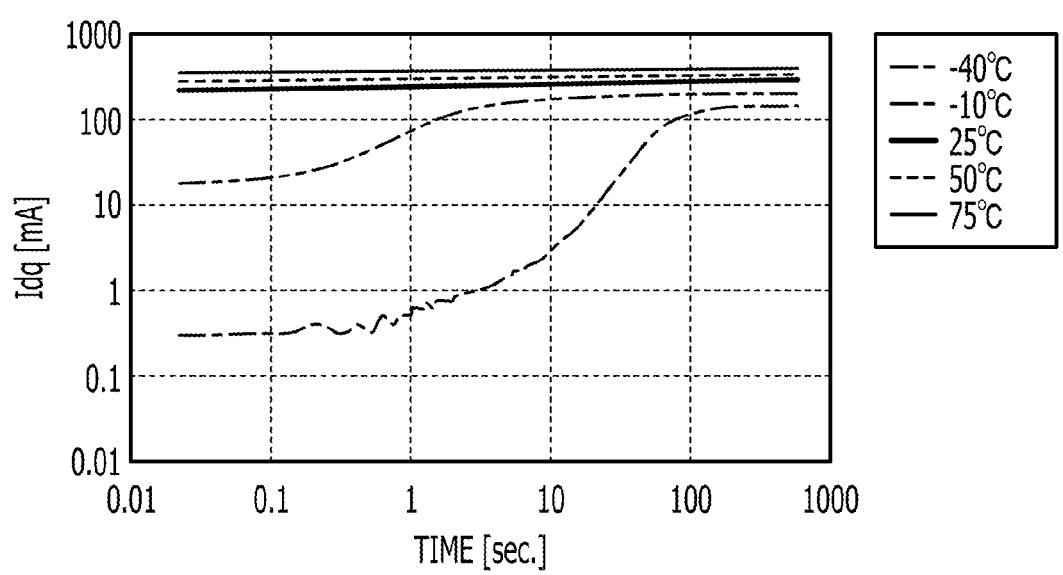
FIG. 1 is a diagram illustrating a characteristic of a GaN-FET device when an Idq drift has occurred.

FIG. 1 is a diagram illustrating the characteristic of the GaN-FET device when the Idq drift has occurred. As illustrated in FIG. 1, when the GaN-FET device is at a high temperature greater than or equal to 25° C., the setting value of the Idq does not change from an initial setting value 500 mA. On the other hand, the Idq is measurably reduced with a decrease in the temperature of the GaN-FET device. For example, when the GaN-FET device is at a low temperature of −40° C., the Idq of the GaN-FET device becomes 0.5 mA.

Figure 2:
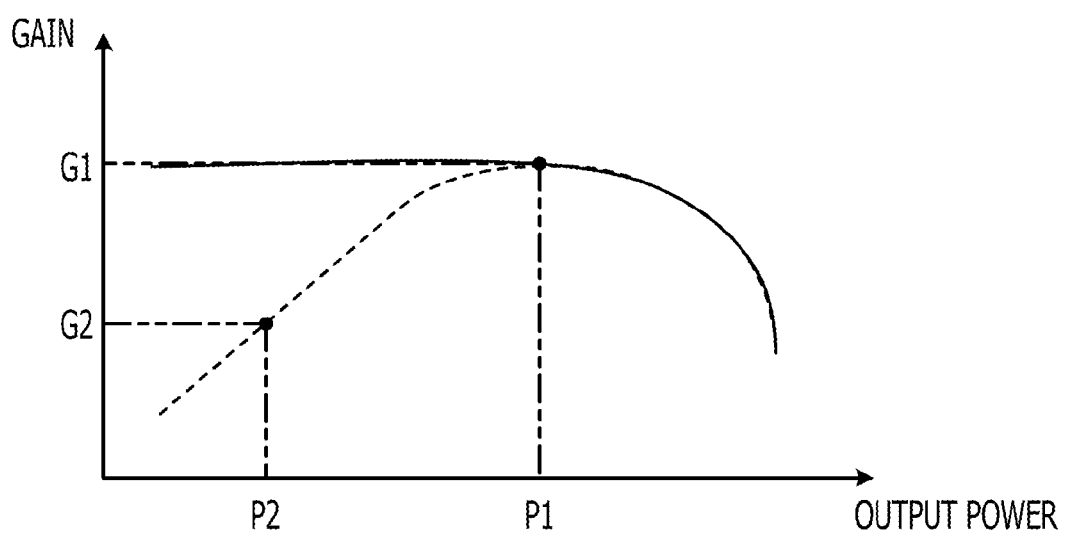
FIG. 2 is a diagram illustrating a relationship between output power and a gain of the GaN-FET when the Idq drift has occurred.

FIG. 2 is a diagram illustrating a relationship between the output power and the gain of the GaN-FET when the Idq drift has occurred. As illustrated in FIG. 2, the gain of the GaN-FET device with respect to output power P1 at the time of saturation is G1. However, the Idq decreases with the reduction of temperature, and when, in a state in which the Idq is low, the output power is lowered from an high output side at the time of saturation to a low output side, the gain of the GaN-FET device is measurably decreased. For example, in the example of FIG. 2, when, in a state in which the Idq is low, the output power is lowered from P1 at the time of saturation to P2 on the low output side, the gain of the GaN-FET device turns out to be lowered from G1 to G2.

In this way, in the amplifier utilizing the GaN-FET device, when, at the time of a low temperature, the output power is controlled so as to change from a high output to a low output, there occurs an Idq drift that the Idq becomes less than or equal to a specified value, and owing to the Idq drift, the gain of the GaN-FET device changes. Accordingly, when a temperature or electric power becomes less than or equal to a threshold value, and the GaN-FET device is put into the state of a low temperature or the state of a low output, it may be considered that the gain of the GaN-FET device is reduced owing to the Idq drift.

Therefore, in the following embodiments, a given value such as a temperature, electric power, or the like is monitored. In addition, based on the monitored given value, it is judged whether or not the gate voltage of the GaN-FET device is to be increased, and when it is judged that the gate voltage of the GaN-FET device is to be increased, the gate voltage of the GaN-FET device is increased in response to the given value. In this way, if the gate voltage of the GaN-FET device is increased at the time of a low temperature or at the time of a low output, the Idq increases and the amount of heat generation in the GaN-FET device increases. Therefore, it may be possible to resolve the change in the gain of the GaN-FET device, which occurs owing to the Idq drift.

[First Embodiment]

Next, a transmission apparatus according to a first embodiment will be described. The transmission apparatus according to the first embodiment detects a temperature as a given value used for monitoring a change in the gain of the GaN-FET device, and judges whether or not the value of the detected temperature is less than or equal to a threshold value. In addition, when the value of the temperature is less than or equal to the threshold value, the transmission apparatus judges that the change in the gain of the GaN-FET device has occurred owing to an Idq drift, and causes the gate voltage of the GaN-FET device to be increased.

Figure 3:
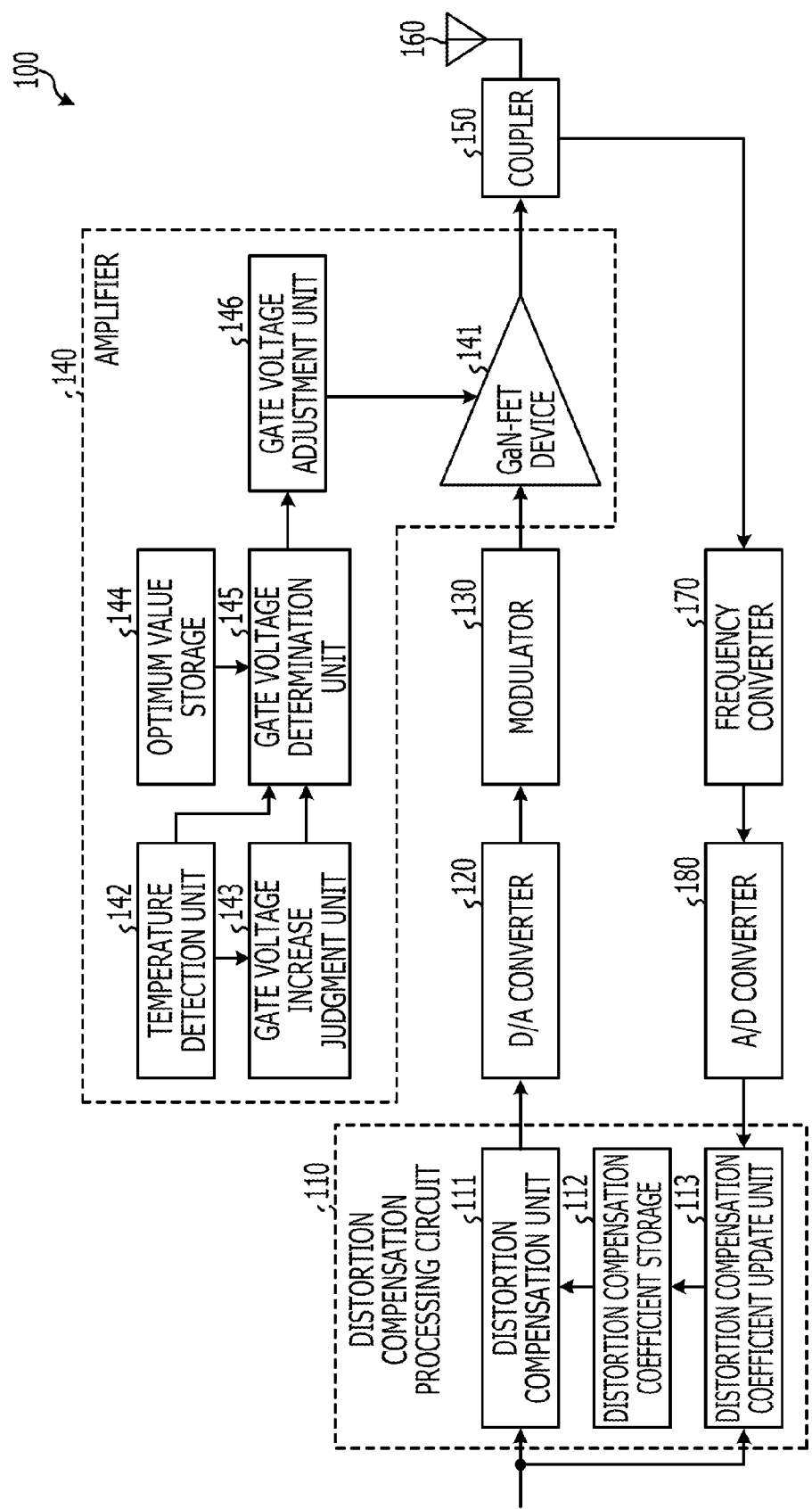
FIG. 3 is a diagram illustrating a configuration of a transmission apparatus according to a first embodiment.

FIG. 3 is a diagram illustrating the configuration of a transmission apparatus 100 according to the first embodiment. As illustrated in FIG. 3, the transmission apparatus 100 includes a distortion compensation processing circuit 110, a digital/analog (D/A) converter 120, a modulator 130, an amplifier 140, a coupler 150, an antenna 160, a frequency converter 170, and an analog/digital (A/D) converter 180.

The distortion compensation processing circuit 110 performs distortion compensation processing on a baseband (BB) signal, and outputs the signal subjected to the distortion compensation processing to the D/A converter 120. For example, the distortion compensation processing circuit 110 includes a distortion compensation unit 111, a distortion compensation coefficient storage 112, and a distortion compensation coefficient update unit 113.

The distortion compensation unit 111 performs distortion compensation processing (predistortion) on the BB signal. For example, the distortion compensation unit 111 acquires, from the distortion compensation coefficient storage 112, a distortion compensation coefficient corresponding to the power of the BB signal, and performs the distortion compensation processing on the BB signal using the acquired distortion compensation coefficient.

The distortion compensation coefficient storage 112 stores therein a distortion compensation coefficient corresponding to the power of the BB signal. The distortion compensation coefficient is a correction value used for maintaining the linearity of the gain of an after-mentioned GaN-FET device 141 included in the amplifier 140, and is a value obtained by inverting the gain of the GaN-FET device 141. In addition, the distortion compensation coefficient storage 112 corresponds to a lookup table (LUT), for example.

The distortion compensation coefficient update unit 113 calculates a distortion compensation coefficient based on the BB signal and a feedback signal fed back from the amplifier 140 through the coupler 150, the frequency converter 170, and the A/D converter 180. For example, the distortion compensation coefficient update unit 113 compares the BB signal and the feedback signal with each other based on adaptive signal processing utilizing a least mean square (LMS) algorithm, and calculates the distortion compensation coefficient so that a difference between the both of the signals becomes zero. In addition, based on the calculated distortion compensation coefficient, the distortion compensation coefficient update unit 113 updates the corresponding distortion compensation coefficient stored in the distortion compensation coefficient storage 112.

The D/A converter 120 converts, into an analog signal, a digital signal input from the distortion compensation processing circuit 110, and outputs the converted signal to the modulator 130. The modulator 130 modulates the signal input from the D/A converter 120, and outputs the modulated signal to the amplifier 140.

The amplifier 140 amplifies the signal input from the modulator 130, using the GaN-FET device, and outputs the amplified signal to the coupler 150. In addition, the amplifier 140 detects a temperature so as to monitor a change in the gain of the GaN-FET device, and causes the gate voltage of the GaN-FET device to be increased based on the detected temperature, thereby increasing the Idq. In addition, the detailed configuration of the amplifier 140 will be described later.

The coupler 150 branches and outputs the signal input from the amplifier 140 to the antenna 160 and the frequency converter 170. The signal output from the coupler 150 to the frequency converter 170 corresponds to the feedback signal fed back from the amplifier 140. The frequency converter 170 converts the frequency of the feedback signal input from the coupler 150, and outputs the converted feedback signal to the A/D converter 180. The A/D converter 180 converts, into a digital feedback signal, the analog feedback signal input from the frequency converter 170, and outputs the converted feedback signal to the distortion compensation processing circuit 110. The antenna 160 radiates the signal input from the coupler 150, to space.

Here, the detailed configuration of the amplifier 140 will be described. As illustrated in FIG. 3, the amplifier 140 includes the GaN-FET device 141, a temperature detection unit 142, a gate voltage increase judgment unit 143, an optimum value storage 144, a gate voltage determination unit 145, and a gate voltage adjustment unit 146.

The GaN-FET device 141 is an amplifying element that amplifies a signal in response to a gate voltage applied to a gate terminal. For example, the GaN-FET device 141 amplifies a signal input from the modulator 130, in response to the gate voltage applied to the gate terminal by the gate voltage adjustment unit 146. In addition, as already described in FIG. 1 and FIG. 2, the gain of the GaN-FET device 141 changes owing to the occurrence of the Idq drift.

The temperature detection unit 142 detects the temperature of the transmission apparatus 100, as one of given values used for monitoring a change in the gain of the GaN-FET device 141, and outputs the value of the detected temperature of the transmission apparatus 100, to the gate voltage increase judgment unit 143 and the gate voltage determination unit 145. In addition, here, while it is assumed that the temperature detection unit 142 detects the temperature of the transmission apparatus 100, the detection of the temperature is not limited to the example, and it may be assumed that the temperature of the GaN-FET device 141 is detected. In this case, it may be desirable that the temperature detection unit 142 is installed in the GaN-FET device 141.

The gate voltage increase judgment unit 143 acquires the value of a temperature from the temperature detection unit 142, and, based on the acquired value of a temperature, judges whether or not the gate voltage of the GaN-FET device 141 is to be increased. For example, when the acquired value of a temperature is less than or equal to a threshold value, since the GaN-FET device 141 has been put into the state of a low temperature, the gate voltage increase judgment unit 143 judges that the gate voltage of the GaN-FET device 141 is to be increased. On the other hand, when the acquired value of a temperature exceeds the threshold value, since the GaN-FET device 141 has not been put into the state of a low temperature, the gate voltage increase judgment unit 143 judges that the gate voltage of the GaN-FET device 141 is not to be increased. In addition, the gate voltage increase judgment unit 143 outputs a judgment result to the gate voltage determination unit 145.

The optimum value storage 144 stores therein the value of the temperature of the transmission apparatus 100 and the optimum value of the gate voltage of the GaN-FET device 141 with the value of the temperature of the transmission apparatus 100 and the optimum value of the gate voltage of the GaN-FET device 141 being associated with each other. Hereinafter, it is assumed that the optimum value of the gate voltage of the GaN-FET device 141 will be simply expressed as an "optimum value" in some cases.

FIG. 4 is a diagram illustrating an example of the optimum value storage 144. As illustrated in FIG. 4, the optimum value storage 144 stores therein "temperature" that is the value of the temperature of the transmission apparatus 100 and "gate voltage" that is the optimum value of the gate voltage of the GaN-FET device 141 with the "temperature" and the "gate voltage" being associated with each other. For example, the first row illustrated in FIG. 4 indicates that when the value of the temperature of the transmission apparatus 100 is "0° C.", the optimum value of the gate voltage of the GaN-FET device 141 is "−1.2 V". In addition, for example, the second row illustrated in FIG. 4 indicates that when the value of the temperature of the transmission apparatus 100 is "−5° C.", the optimum value of the gate voltage of the GaN-FET device 141 is "−1.1875 V". In addition, the first row illustrated in FIG. 4 indicates that a threshold value used when the gate voltage increase judgment unit 143 judges whether or not the gate voltage of the GaN-FET device 141 is to be increased is "0° C.".

In addition, the optimum value stored in the optimum value storage 144 increases with a decrease in the value of the temperature of the transmission apparatus 100. Namely, the gate voltage of the GaN-FET device 141 increases with the transmission apparatus 100 having a lower temperature. In the example illustrated in FIG. 4, when the "temperature" is lowered in such a manner as "0° C.", "−5° C.", . . . , and "−40° C.", the "gate voltage" that is the optimum value increases in such a manner as "−1.2 V", "−1.1875 V", . . . , and "−1.1 V", respectively.

In addition, in response to the reduction of the value of the temperature of the transmission apparatus 100, the optimum value may linearly increase, increase in a quadratic function manner, or increase in an exponential manner. Such an increase gradient of the optimum value is arbitrarily adjusted by a designer.

Returning to FIG. 3, the gate voltage determination unit 145 acquires the judgment result from the gate voltage increase judgment unit 143, and acquires the value of a temperature from the temperature detection unit 142. In response to the judgment result, the gate voltage determination unit 145 outputs the value of the increased gate voltage of the GaN-FET device 141 to the gate voltage adjustment unit 146. For example, when having acquired the judgment result indicating that the gate voltage is to be increased, the gate voltage determination unit 145 acquires the optimum value corresponding to the value of a temperature by referring to the optimum value storage 144, and determines the acquired optimum value as the increased gate voltage. In addition, the gate voltage determination unit 145 outputs, to the gate voltage adjustment unit 146, the determined value of the increased gate voltage. On the other hand, when having acquired the judgment result indicating that the gate voltage is not to be increased, the gate voltage determination unit 145 does not output the value of the gate voltage to the gate voltage adjustment unit 146.

When having acquired the value of the increased gate voltage from the gate voltage determination unit 145, the gate voltage adjustment unit 146 adjusts, using a potentiometer, the gate voltage of the GaN-FET device 141 so that the gate voltage of the GaN-FET device 141 becomes the acquired value of the increased gate voltage.

Here, using the example illustrated in FIG. 2, a specific example of processing will be described that is performed by the gate voltage determination unit 145 when the judgment result indicating that the gate voltage is to be increased has been acquired. First, a case will be described in which the gate voltage determination unit 145 has acquired the value of a temperature, "−5° C.", from the temperature detection unit 142. In this case, the gate voltage determination unit 145 acquires the optimum value, "−1.1875 V", corresponding to the value of a temperature, "−5° C.", by referring to the optimum value storage 144. In addition, the gate voltage determination unit 145 determines the acquired optimum value, "−1.1875 V", as the increased gate voltage, and outputs the determined value of the increased gate voltage, "−1.1875 V", to the gate voltage adjustment unit 146. Accordingly, the gate voltage of the GaN-FET device 141 increases from a previous value to "−1.1875 V".

Next, a case will be described in which the gate voltage determination unit 145 has acquired the value of a temperature, "−20° C.", from the temperature detection unit 142. In this case, the gate voltage determination unit 145 acquires the optimum value, "−1.15 V", corresponding to the value of a temperature, "−20° C.", by referring to the optimum value storage 144. In addition, the gate voltage determination unit 145 determines the acquired optimum value, "−1.15 V", as the increased gate voltage, and outputs the determined value of the increased gate voltage, "−1.15 V", to the gate voltage adjustment unit 146. Accordingly, the gate voltage of the GaN-FET device 141 increases from "−1.1875 V" to "−1.15 V".

In this way, the gate voltage determination unit 145 increases the gate voltage of the GaN-FET device 141 with a decrease in the value of the temperature of the transmission apparatus 100. Since, in response to this, the Idq increases, and the amount of heat generation in the GaN-FET device 141 increases, it may be possible to resolve the change in the gain of the GaN-FET device, which occurs owing to the Idq drift.

Figure 5:
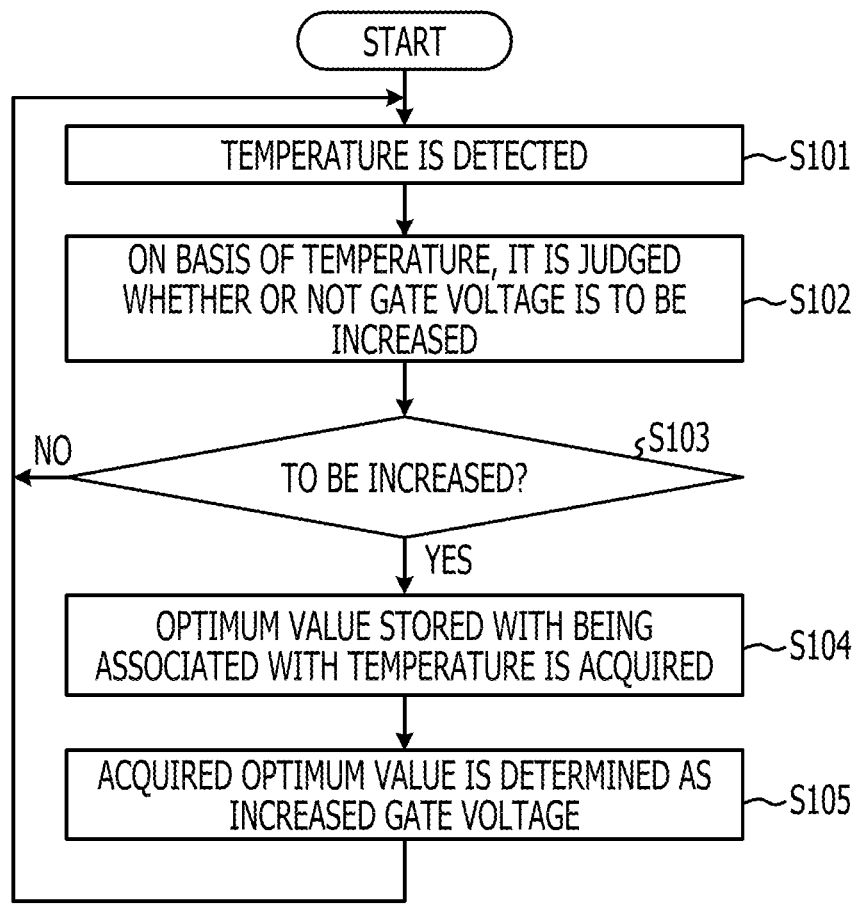
FIG. 5 is a flowchart illustrating a processing procedure of gate voltage determination processing performed by an amplifier according to the first embodiment.

Next, the processing procedure of gate voltage determination processing will be described that is performed by the amplifier 140 according to the first embodiment. FIG. 5 is a flowchart illustrating the processing procedure of the gate voltage determination processing performed by the amplifier 140 according to the first embodiment. As illustrated in FIG. 5, the temperature detection unit 142 in the amplifier 140 detects the temperature of the transmission apparatus 100 (Step S101).

Based on the temperature detected by the temperature detection unit 142, the gate voltage increase judgment unit 143 judges whether or not the gate voltage of the GaN-FET device 141 is to be increased (Step S102). For example, when the value of the temperature is less than or equal to the threshold value, the gate voltage increase judgment unit 143 judges that the gate voltage of the GaN-FET device 141 is to be increased. On the other hand, when the value of the temperature exceeds the threshold value, the gate voltage increase judgment unit 143 judges that the gate voltage of the GaN-FET device 141 is not to be increased.

When the gate voltage of the GaN-FET device 141 is not to be increased (Step S103: negative), the gate voltage determination unit 145 returns the processing to Step S101. On the other hand, when the gate voltage increase judgment unit 143 judges that the gate voltage of the GaN-FET device 141 is to be increased (Step S103: affirmative), the gate voltage determination unit 145 refers to the optimum value storage 144. In addition, the gate voltage determination unit 145 acquires, from the optimum value storage 144, the optimum value corresponding to the value of the temperature detected by the temperature detection unit 142 (Step S104), determines the acquired optimum value as the increased gate voltage (Step S105), and returns the processing to Step S101.

As described above, the transmission apparatus 100 according to the first embodiment detects a temperature as a given value used for monitoring a change in the gain of the GaN-FET device, and judges whether or not the value of the detected temperature is less than or equal to the threshold value. In addition, when the value of the temperature is less than or equal to the threshold value, the transmission apparatus 100 determines the increased gate voltage of the GaN-FET device in response to the value of the temperature. Therefore, it may be possible for the transmission apparatus 100 to increase the gate voltage of the GaN-FET device at the time of a low temperature at which the Idq measurably occurs, and it may be possible for the transmission apparatus 100 to increase the amount of heat generation in the GaN-FET device by increasing the Idq. As a result, it may be possible for the transmission apparatus 100 to resolve the change in the gain of the GaN-FET device, which occurs owing to the Idq drift.

In addition, by referring to the optimum value storage 144 storing therein the value of a temperature and the optimum value of the gate voltage with the value of a temperature and the optimum value of the gate voltage being associated with each other, the transmission apparatus 100 according to the first embodiment determines the optimum value corresponding to the value of a temperature, as the increased gate voltage of the GaN-FET device. Therefore, since, compared with a method in which a gate voltage is dynamically adjusted in response to the value of a temperature, it may be possible for the transmission apparatus 100 to shorten a time taken for searching the optimum value of the gate voltage, it may be possible to swiftly increase the gate voltage of the GaN-FET device at the time of a low temperature. As a result, it may be possible for the transmission apparatus 100 to effectively resolve the change in the gain of the GaN-FET device, which occurs owing to the Idq drift.

[Second Embodiment]

In the first embodiment, a configuration has been described in which a temperature is detected as a given value used for monitoring a change in the gain of the GaN-FET device. However, input power may also be used as a given value used for monitoring a change in the gain of the GaN-FET device. Therefore, in a second embodiment, a case will be described in which the input power is detected as a given value used for monitoring a change in the gain of the GaN-FET device.

Figure 6:
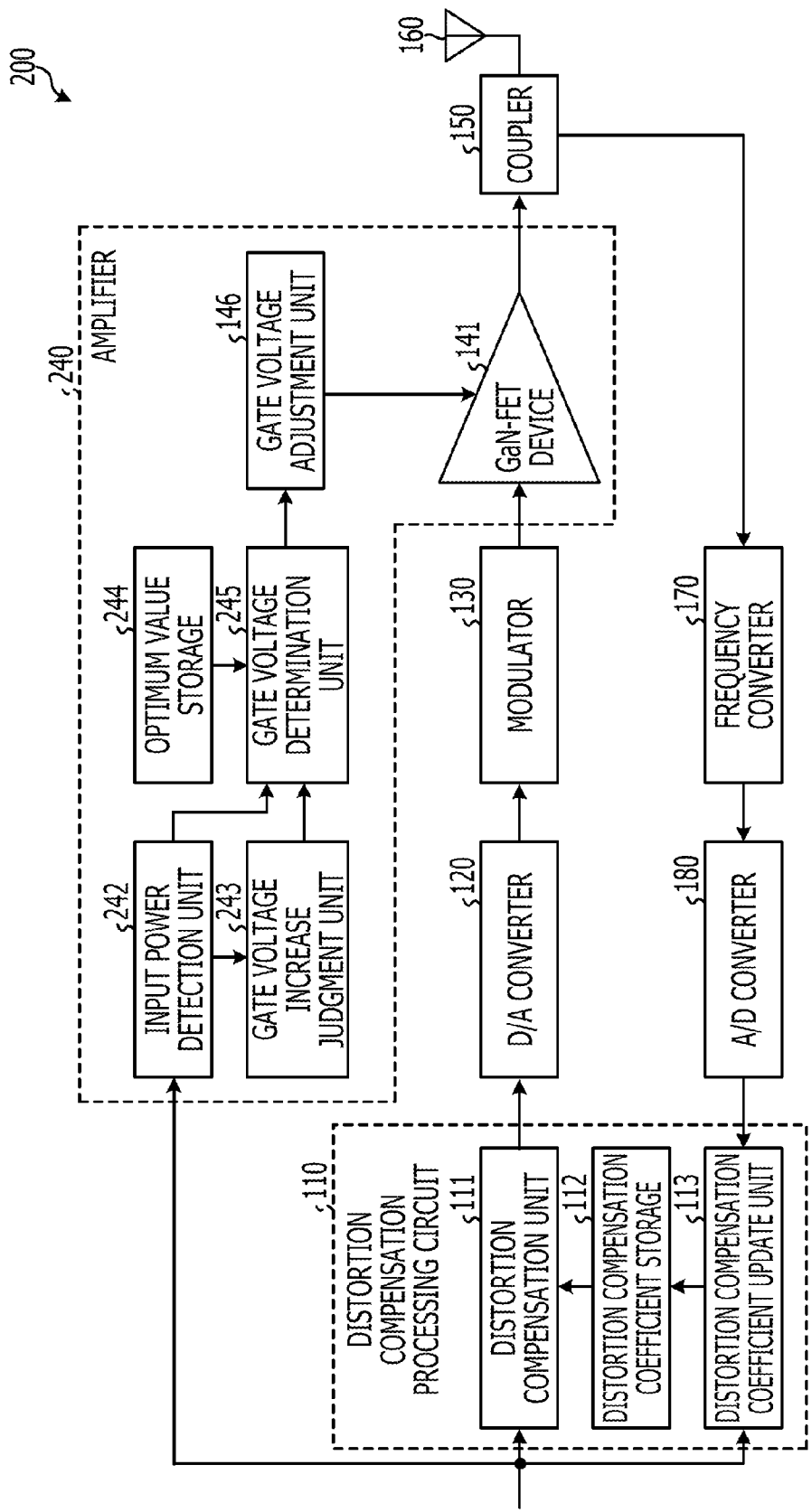
FIG. 6 is a diagram illustrating a configuration of a transmission apparatus according to a second embodiment.

FIG. 6 is a diagram illustrating the configuration of a transmission apparatus 200 according to the second embodiment. In addition, hereinafter, the same symbol will be assigned to the same configuration as in the first embodiment described above in FIG. 3, and the description thereof will be omitted. As illustrated in FIG. 6, the transmission apparatus 200 includes the distortion compensation processing circuit 110, the D/A converter 120, the modulator 130, an amplifier 240, the coupler 150, the antenna 160, the frequency converter 170, and the A/D converter 180.

The amplifier 240 amplifies the signal input from the modulator 130, using the GaN-FET device, and outputs the amplified signal to the coupler 150. In addition, the amplifier 240 detects input power so as to monitor a change in the gain of the GaN-FET device, and causes the gate voltage of the GaN-FET device to be increased based on the detected input power, thereby increasing the Idq.

The amplifier 240 includes the GaN-FET device 141, an input power detection unit 242, a gate voltage increase judgment unit 243, an optimum value storage 244, a gate voltage determination unit 245, and the gate voltage adjustment unit 146.

The input power detection unit 242 detects the input power of the transmission apparatus 200, as one of given values used for monitoring a change in the gain of the GaN-FET device 141, and outputs the value of the detected input power, to the gate voltage increase judgment unit 243 and the gate voltage determination unit 245. In addition, here, while it is assumed that the input power detection unit 242 detects the input power of the transmission apparatus 200, the detection of the input power is not limited to the example, and it may be assumed that the input power of the GaN-FET device 141 is detected.

In this case, it may be desirable that the input power detection unit 242 is installed in the GaN-FET device 141.

The gate voltage increase judgment unit 243 acquires the value of input power from the input power detection unit 242, and, based on the acquired value of input power, judges whether or not the gate voltage of the GaN-FET device 141 is to be increased. When the acquired value of input power is less than or equal to a threshold value, since the GaN-FET device 141 has been put into the state of a low output, the gate voltage increase judgment unit 243 judges that the gate voltage of the GaN-FET device 141 is to be increased. On the other hand, when the acquired value of input power exceeds the threshold value, since the GaN-FET device 141 has not been put into the state of a low output, the gate voltage increase judgment unit 243 judges that the gate voltage of the GaN-FET device 141 is not to be increased. In addition, the gate voltage increase judgment unit 243 outputs a judgment result to the gate voltage determination unit 245.

The optimum value storage 244 stores therein the value of the input power of the transmission apparatus 200 and the optimum value of the gate voltage of the GaN-FET device 141 with the value of the input power of the transmission apparatus 200 and the optimum value of the gate voltage of the GaN-FET device 141 being associated with each other. Hereinafter, it is assumed that the optimum value of the gate voltage of the GaN-FET device 141 will be simply expressed as an "optimum value" in some cases.

FIG. 7 is a diagram illustrating an example of the optimum value storage 244. As illustrated in FIG. 7, the optimum value storage 244 stores therein "input power" that is the value of the input power of the transmission apparatus 200 and "gate voltage" that is the optimum value of the gate voltage of the GaN-FET device 141 with the "input power" and the "gate voltage" being associated with each other. For example, the first row illustrated in FIG. 7 indicates that when the value of the input power value of the transmission apparatus 200 is "30 dBm", the optimum value of the gate voltage of the GaN-FET device 141 is "−1.2 V". In addition, for example, the second row illustrated in FIG. 7 indicates that when the value of the input power of the transmission apparatus 200 is "28 dBm", the optimum value of the gate voltage of the GaN-FET device 141 is "−1.1875 V". In addition, the first row illustrated in FIG. 7 indicates that a threshold value used when the gate voltage increase judgment unit 243 judges whether or not the gate voltage of the GaN-FET device 141 is to be increased is "30 dBm".

In addition, the optimum value stored in the optimum value storage 244 increases with a decrease in the value of the input power of the transmission apparatus 200. Namely, the gate voltage of the GaN-FET device 141 increases with the transmission apparatus 200 having a lower output. In the example illustrated in FIG. 7, when the "input power" is lowered in such a manner as "30 dBm", "28 dBm", . . . , and "14 dBm", the "gate voltage" that is the optimum value increases in such a manner as "−1.2 V", "−1.1875 V", . . . , and "−1.1 V", respectively.

In addition, in response to the reduction of the value of the input power of the transmission apparatus 200, the optimum value may linearly increase, increase in a quadratic function manner, or increase in an exponential manner. Such an increase gradient of the optimum value is arbitrarily adjusted by a designer.

Returning to FIG. 6, the gate voltage determination unit 245 acquires the judgment result from the gate voltage increase judgment unit 243, and acquires the value of input power from the input power detection unit 242. In response to the judgment result, the gate voltage determination unit 245 outputs the value of the increased gate voltage of the GaN-FET device 141 to the gate voltage adjustment unit 146. When having acquired the judgment result indicating that the gate voltage is to be increased, the gate voltage determination unit 245 acquires the optimum value corresponding to the value of input power by referring to the optimum value storage 244, and determines the acquired optimum value as the increased gate voltage. In addition, the gate voltage determination unit 245 outputs, to the gate voltage adjustment unit 146, the determined value of the increased gate voltage. On the other hand, when having acquired the judgment result indicating that the gate voltage is not to be increased, the gate voltage determination unit 245 does not output the value of the gate voltage to the gate voltage adjustment unit 146.

Here, using the example illustrated in FIG. 7, a specific example of processing will be described that is performed by the gate voltage determination unit 245 when the judgment result indicating that the gate voltage is to be increased has been acquired. First, a case will be described in which the gate voltage determination unit 245 has acquired the value of the input power, "28 dBm", from the input power detection unit 242. In this case, the gate voltage determination unit 245 acquires the optimum value, "−1.1875 V", corresponding to the value of the input power, "28 dBm", by referring to the optimum value storage 244. In addition, the gate voltage determination unit 245 determines the acquired optimum value, "−1.1875 V", as the increased gate voltage, and outputs the determined value of the increased gate voltage, "−1.1875 V", to the gate voltage adjustment unit 146. Accordingly, the gate voltage of the GaN-FET device 141 increases from a previous value to "−1.1875 V".

Next, a case will be described in which the gate voltage determination unit 245 has acquired the value of the input power, "22 dBm", from the input power detection unit 242. In this case, the gate voltage determination unit 245 acquires the optimum value, "−1.15 V", corresponding to the value of the input power, "22 dBm", by referring to the optimum value storage 244. In addition, the gate voltage determination unit 245 determines the acquired optimum value, "−1.15 V", as the increased gate voltage, and outputs the determined value of the increased gate voltage, "−1.15 V", to the gate voltage adjustment unit 146. Accordingly, the gate voltage of the GaN-FET device 141 increases from "−1.1875 V" to "−1.15 V".

In this way, the gate voltage determination unit 245 increases the gate voltage of the GaN-FET device 141 with a decrease in the value of the input power of the transmission apparatus 200. Since, in response to this, the Idq increases, and the amount of heat generation in the GaN-FET device 141 increases, it may be possible to resolve the change in the gain of the GaN-FET device, which occurs owing to the Idq drift.

Figure 8:
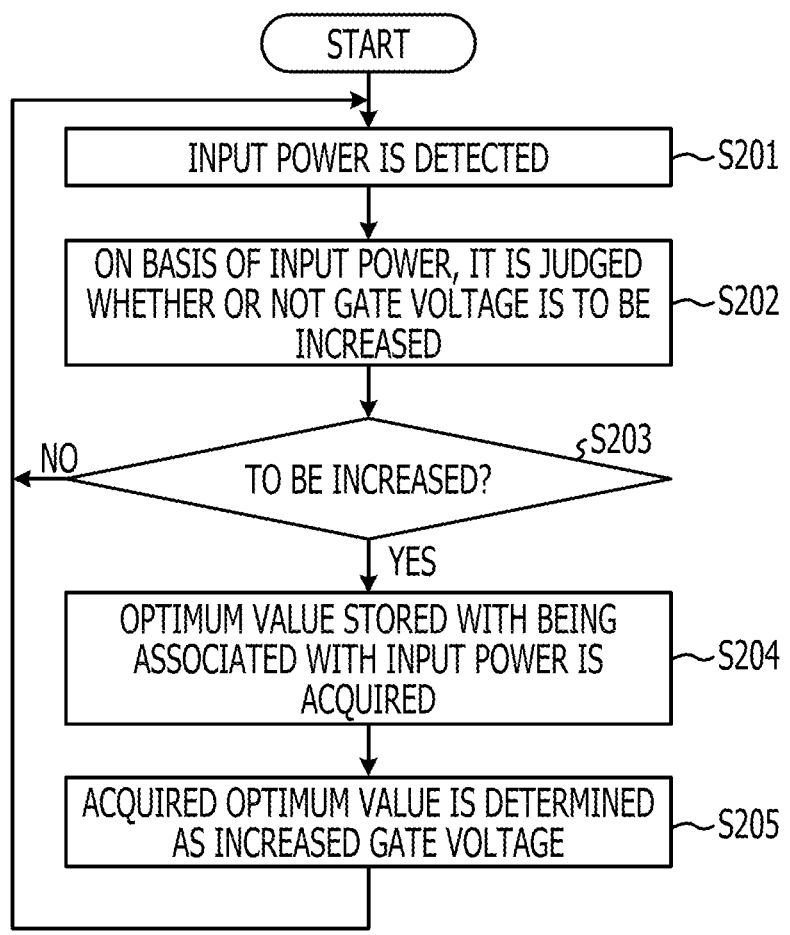
FIG. 8 is a flowchart illustrating a processing procedure of gate voltage determination processing performed by an amplifier according to the second embodiment.

Next, the processing procedure of gate voltage determination processing will be described that is performed by the amplifier 240 according to the second embodiment. FIG. 8 is a flowchart illustrating the processing procedure of the gate voltage determination processing performed by the amplifier 240 according to the second embodiment. As illustrated in FIG. 8, the input power detection unit 242 in the amplifier 240 detects the input power of the transmission apparatus 200 (Step S201).

Based on the input power detected by the input power detection unit 242, the gate voltage increase judgment unit 243 judges whether or not the gate voltage of the GaN-FET device 141 is to be increased (Step S202). Specifically, when the value of the input power is less than or equal to the threshold value, the gate voltage increase judgment unit 243 judges that the gate voltage of the GaN-FET device 141 is to be increased. On the other hand, when the value of the input power exceeds the threshold value, the gate voltage increase judgment unit 243 judges that the gate voltage of the GaN-FET device 141 is not to be increased.

When the gate voltage of the GaN-FET device 141 is not to be increased (Step S203: negative), the gate voltage increase judgment unit 243 returns the processing to Step S201. On the other hand, when the gate voltage increase judgment unit 243 judges that the gate voltage of the GaN-FET device 141 is to be increased (Step S203: affirmative), the gate voltage determination unit 245 refers to the optimum value storage 244. In addition, the gate voltage determination unit 245 acquires, from the optimum value storage 244, the optimum value corresponding to the value of the input power detected by the input power detection unit 242 (Step S204), determines the acquired optimum value as the increased gate voltage (Step S205), and returns the processing to Step S201.

As described above, the transmission apparatus 200 according to the second embodiment detects the input power as a given value used for monitoring a change in the gain of the GaN-FET device 141, and judges whether or not the value of the detected input power is less than or equal to the threshold value. In addition, when the value of the input power is less than or equal to the threshold value, the transmission apparatus 200 determines the increased gate voltage of the GaN-FET device 141 in response to the value of the input power. Therefore, it may be possible for the transmission apparatus 200 to increase the gate voltage of the GaN-FET device 141 at the time of a low output at which the Idq measurably occurs, and it may be possible for the transmission apparatus 200 to increase the amount of heat generation in the GaN-FET device 141 by increasing the Idq. As a result, it may be possible for the transmission apparatus 200 to resolve the change in the gain of the GaN-FET device 141, which occurs owing to the Idq drift.

In addition, by referring to the optimum value storage 244 storing therein the value of the input power and the optimum value of the gate voltage with the value of the input power and the optimum value of the gate voltage being associated with each other, the transmission apparatus 200 according to the second embodiment determines the optimum value corresponding to the value of the input power, as the increased gate voltage of the GaN-FET device 141. Therefore, since, compared with a method in which a gate voltage is dynamically adjusted in response to the value of the input power, it may be possible for the transmission apparatus 200 to shorten a time taken for searching the optimum value of the gate voltage, it may be possible to swiftly increase the gate voltage of the GaN-FET device 141 at the time of a low output. As a result, it may be possible for the transmission apparatus 200 to effectively resolve the change in the gain of the GaN-FET device 141, which occurs owing to the Idq drift.

[Third Embodiment]

In the first or second embodiment, a configuration has been described in which a temperature or input power is detected as a given value used for monitoring a change in the gain of the GaN-FET device. However, a distortion compensation coefficient may also be detected as a given value used for monitoring a change in the gain of the GaN-FET device. Therefore, in a third embodiment, a case will be described in which the distortion compensation coefficient is detected as a given value used for monitoring a change in the gain of the GaN-FET device.

First, there will be described a reason that, in the present embodiment, the distortion compensation coefficient is detected as a given value used for monitoring a change in the gain of the GaN-FET device. A distortion compensation processing circuit included in a transmission apparatus compensates a nonlinear distortion occurring in an amplifier, so as to avoid the degradation of communication quality. Namely, using the distortion compensation coefficient stored in a given storage, the distortion compensation processing circuit performs distortion compensation processing on a signal input to the amplifier. Here, the distortion compensation coefficient is a correction value used for maintaining the linearity of the gain of the GaN-FET device included in the amplifier, and is a value obtained by inverting the gain of the GaN-FET device. Namely, when the gain of the GaN-FET device decreases, the distortion compensation coefficient inversely increases.

Figure 9:
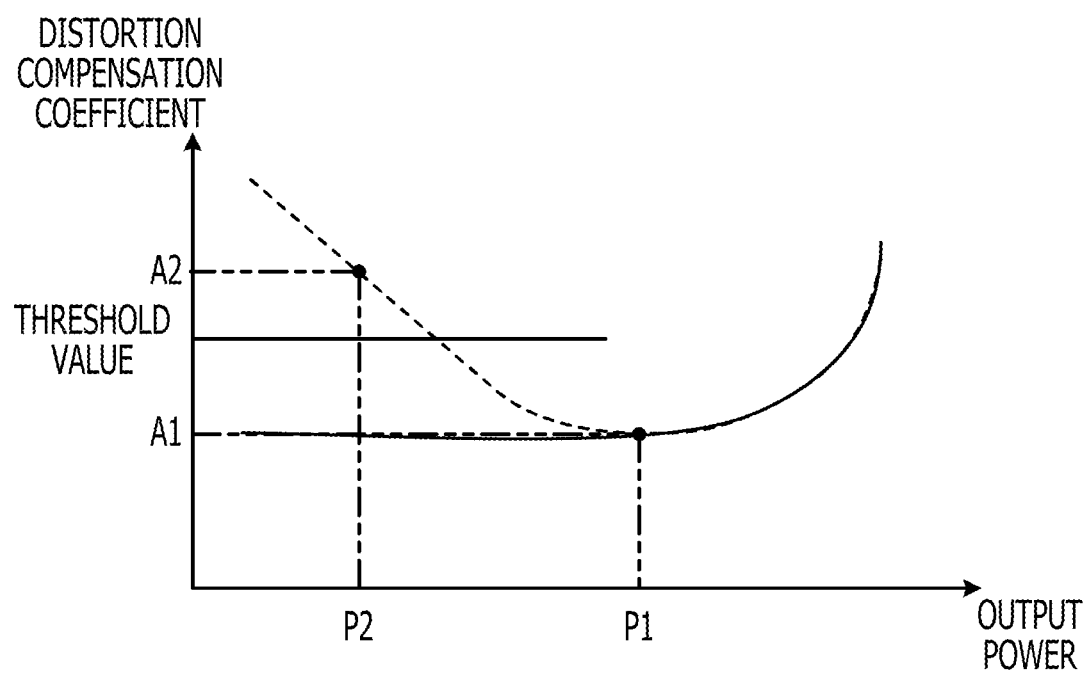
FIG. 9 is a diagram illustrating a relationship between output power of the GaN-FET and a distortion compensation coefficient when the Idq drift has occurred.

FIG. 9 is a diagram illustrating a relationship between the output power of the GaN-FET and the distortion compensation coefficient when the Idq drift has occurred. In addition, the distortion compensation coefficient illustrated in FIG. 9 is a value obtained by inverting the gain of the GaN-FET device illustrated in FIG. 1. As illustrated in FIG. 9, the distortion compensation coefficient with respect to output power P1 at the time of saturation is A1. However, the Idq decreases with the reduction of temperature, and when, in a state in which the Idq is low, the output power is lowered from an high output side at the time of saturation to a low output side, the gain of the GaN-FET device is measurably decreased while the distortion compensation coefficient is measurably increased. For example, in the example of FIG. 9, when, in a state in which the Idq is low, the output power is lowered from P1 at the time of saturation to P2 on the low output side, the distortion compensation coefficient turns out to be increased from the A1 to A2.

In this way, in the amplifier utilizing the GaN-FET device, when, at the time of a low temperature, the output power is controlled so as to change from a high output to a low output, there occurs an Idq drift that the Idq becomes less than or equal to a specified value, and owing to the Idq drift, the gain and the distortion compensation coefficient change. Accordingly, when a temperature or output power becomes less than or equal to a threshold value, and the GaN-FET device is put into the state of a low temperature or the state of a low output, it may be considered that, owing to the Idq drift, the gain is decreased while the distortion compensation coefficient is increased. Namely, if the distortion compensation coefficient is detected, it may be possible to judge, based on such an increase of the distortion compensation coefficient, that a change in the gain of the GaN-FET device has occurred owing to the Idq drift. For example, in the example of FIG. 9, since the increased distortion compensation coefficient A2 is greater than or equal to a threshold value, it may be possible to judge that a change in the gain of the GaN-FET device has occurred owing to the Idq drift.

Therefore, in a transmission apparatus in the present embodiment, the distortion compensation coefficient is monitored in place of the temperature or the electric power. In addition, based on the monitored distortion compensation coefficient, it is judged whether or not the gate voltage of the GaN-FET device is to be increased, and when it is judged that the gate voltage of the GaN-FET device is to be increased, the gate voltage of the GaN-FET device is increased in response to the distortion compensation coefficient. In this way, if the gate voltage of the GaN-FET device is increased at the time of a low temperature or at the time of a low output, at which the distortion compensation coefficient measurably changes, the Idq increases and the amount of heat generation in the GaN-FET device increases. Therefore, it may be possible to resolve the change in the gain of the GaN-FET device, which occurs owing to the Idq drift.

Figure 10:
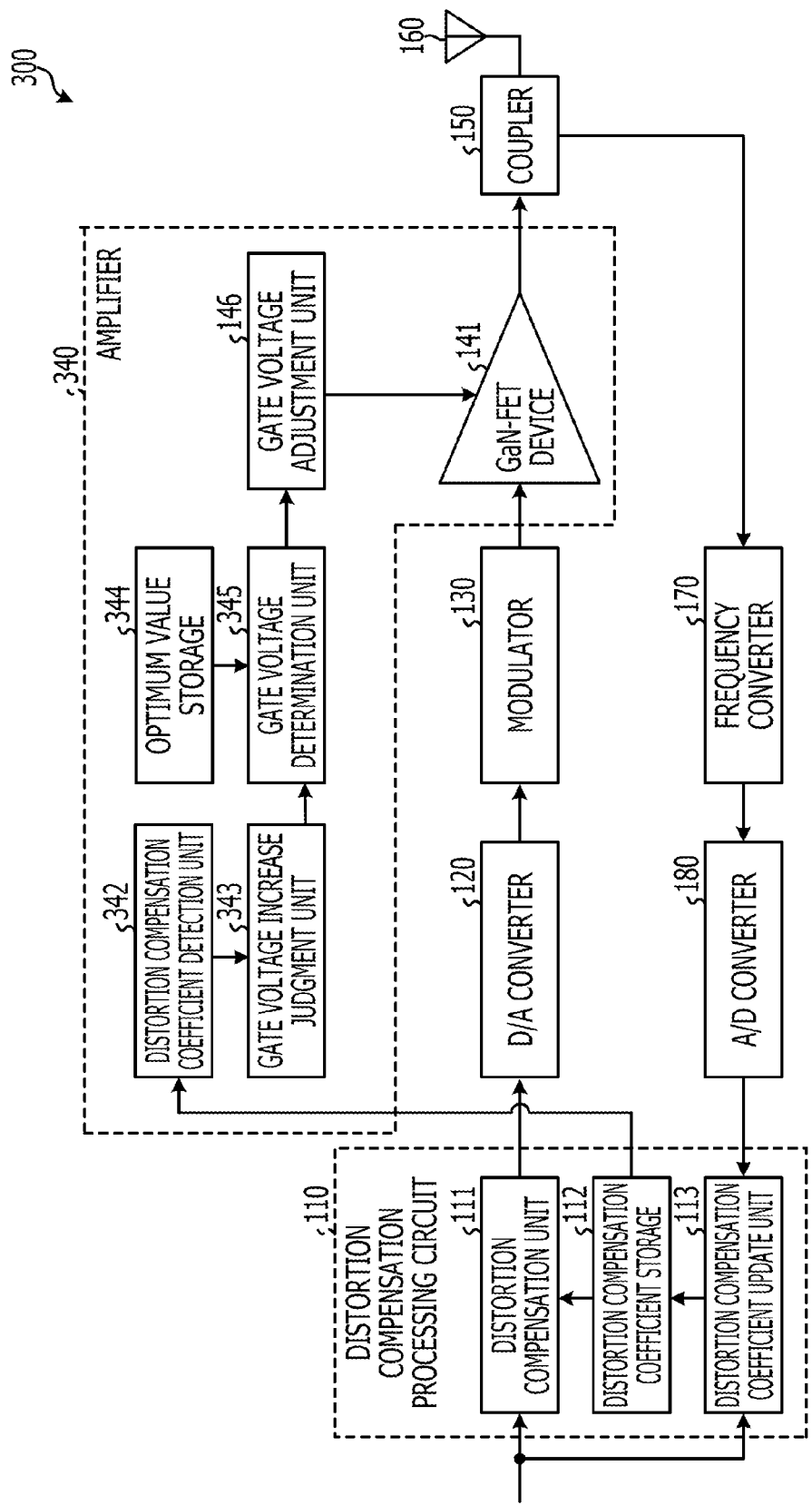
FIG. 10 is a diagram illustrating a configuration of a transmission apparatus according to a third embodiment.

FIG. 10 is a diagram illustrating the configuration of a transmission apparatus 300 according to the third embodiment. In addition, hereinafter, the same symbol will be assigned to the same configuration as in the first embodiment described above in FIG. 3, and the description thereof will be omitted. As illustrated in FIG. 10, the transmission apparatus 300 includes the distortion compensation processing circuit 110, the D/A converter 120, the modulator 130, an amplifier 340, the coupler 150, the antenna 160, the frequency converter 170, and the A/D converter 180.

The amplifier 340 amplifies the signal input from the modulator 130, using the GaN-FET device, and outputs the amplified signal to the coupler 150. In addition, the amplifier 340 detects a distortion compensation coefficient so as to monitor a change in the gain of the GaN-FET device, and causes the gate voltage of the GaN-FET device to be increased based on the detected distortion compensation coefficient, thereby increasing the Idq.

Specifically, the amplifier 340 includes the GaN-FET device 141, a distortion compensation coefficient detection unit 342, a gate voltage increase judgment unit 343, an optimum value storage 344, a gate voltage determination unit 345, and the gate voltage adjustment unit 146.

The distortion compensation coefficient detection unit 342 detects the distortion compensation coefficient, as one of given values used for monitoring a change in the gain of the GaN-FET device 141, and outputs the value of the detected distortion compensation coefficient, to the gate voltage increase judgment unit 343 and the gate voltage determination unit 345. Specifically, by acquiring a corresponding distortion compensation coefficient from the distortion compensation coefficient storage 112 in the distortion compensation processing circuit 110, the distortion compensation coefficient detection unit 342 detects the distortion compensation coefficient. The distortion compensation coefficient is a correction value used for maintaining the linearity of the gain of the GaN-FET device 141, and is a value obtained by inverting the gain of the GaN-FET device 141. Namely, when the gain of the GaN-FET device 141 decreases, the distortion compensation coefficient inversely increases.

The gate voltage increase judgment unit 343 acquires the value of a distortion compensation coefficient from the distortion compensation coefficient detection unit 342, and, based on the acquired value of the distortion compensation coefficient, judges whether or not the gate voltage of the GaN-FET device 141 is to be increased. Specifically, when the value of the distortion compensation coefficient is greater than or equal to a threshold value, since the GaN-FET device 141 has been put into the state of a low output, the gate voltage increase judgment unit 343 judges that the gate voltage of the GaN-FET device 141 is to be increased. On the other hand, when the value of the distortion compensation coefficient is less than the threshold value, since the GaN-FET device 141 has not been put into the state of a low output, the gate voltage increase judgment unit 343 judges that the gate voltage of the GaN-FET device 141 is not to be increased. In addition, the gate voltage increase judgment unit 343 outputs a judgment result to the gate voltage determination unit 345.

The optimum value storage 344 stores therein the value of the distortion compensation coefficient and the optimum value of the gate voltage of the GaN-FET device 141 with the value of the distortion compensation coefficient and the optimum value of the gate voltage of the GaN-FET device 141 being associated with each other. Hereinafter, it is assumed that the optimum value of the gate voltage of the GaN-FET device 141 will be simply expressed as an "optimum value" in some cases.

FIG. 11 is a diagram illustrating an example of the optimum value storage 344. As illustrated in FIG. 11, the optimum value storage 344 stores therein "distortion compensation coefficient" that is the value of the distortion compensation coefficient and "gate voltage" that is the optimum value of the gate voltage of the GaN-FET device 141 with the "distortion compensation coefficient" and the "gate voltage" being associated with each other. For example, the first row illustrated in FIG. 11 indicates that when the value of the distortion compensation coefficient is "1", the optimum value of the gate voltage of the GaN-FET device 141 is "−1.2 V". In addition, for example, the second row illustrated in FIG. 11 indicates that when the value of the distortion compensation coefficient is "1.1", the optimum value of the gate voltage of the GaN-FET device 141 is "−1.1875 V". In addition, the first row illustrated in FIG. 11 indicates that a threshold value used when the gate voltage increase judgment unit 343 judges whether or not the gate voltage of the GaN-FET device 141 is to be increased is "1".

In addition, the optimum value stored in the optimum value storage 344 increases with an increase in the value of the distortion compensation coefficient. Namely, the gate voltage of the GaN-FET device 141 increases with the transmission apparatus 300 having a lower temperature or a lower output. In the example illustrated in FIG. 11, when the "distortion compensation coefficient" increases in such a manner as "1", "1.1", . . . , and "1.8", the "gate voltage" that is the optimum value increases in such a manner as "−1.2 V", "−1.1875 V", . . . , and "−1.1 V", respectively.

In addition, in response to the increase of the value of the distortion compensation coefficient, the optimum value may linearly increase, increase in a quadratic function manner, or increase in an exponential manner. Such an increase gradient of the optimum value is arbitrarily adjusted by a designer.

Returning to FIG. 10, the gate voltage determination unit 345 acquires the judgment result from the gate voltage increase judgment unit 343, and acquires the value of a distortion compensation coefficient from the distortion compensation coefficient detection unit 342. In response to the judgment result, the gate voltage determination unit 345 outputs the value of the increased gate voltage of the GaN-FET device 141 to the gate voltage adjustment unit 146. Specifically, when having acquired the judgment result indicating that the gate voltage is to be increased, the gate voltage determination unit 345 acquires the optimum value corresponding to the value of a distortion compensation coefficient by referring to the optimum value storage 344, and determines the acquired optimum value as the increased gate voltage. In addition, the gate voltage determination unit 345 outputs, to the gate voltage adjustment unit 146, the determined value of the increased gate voltage. On the other hand, when having acquired the judgment result indicating that the gate voltage is not to be increased, the gate voltage determination unit 345 does not output the value of the gate voltage to the gate voltage adjustment unit 146.

Here, using the example illustrated in FIG. 11, a specific example of processing will be described that is performed by the gate voltage determination unit 345 when the judgment result indicating that the gate voltage is to be increased has been acquired. First, a case will be described in which the gate voltage determination unit 345 has acquired the value of the distortion compensation coefficient, "1.1", from the distortion compensation coefficient detection unit 342. In this case, the gate voltage determination unit 345 acquires the optimum value, "−1.1875 V", corresponding to the distortion compensation coefficient, "1.1", by referring to the optimum value storage 344. In addition, the gate voltage determination unit 345 determines the acquired optimum value, "−1.1875 V", as the increased gate voltage, and outputs the determined value of the increased gate voltage, "−1.1875 V", to the gate voltage adjustment unit 146. Accordingly, the gate voltage of the GaN-FET device 141 increases from a previous value to "−1.1875 V".

Next, a case will be described in which the gate voltage determination unit 345 has acquired the value of the distortion compensation coefficient, "1.4", from the distortion compensation coefficient detection unit 342. In this case, the gate voltage determination unit 345 acquires the optimum value, "−1.15 V", corresponding to the value of the distortion compensation coefficient, "1.4", by referring to the optimum value storage 344. In addition, the gate voltage determination unit 345 determines the acquired optimum value, "−1.15 V", as the increased gate voltage, and outputs the determined value of the increased gate voltage, "−1.15 V", to the gate voltage adjustment unit 146. Accordingly, the gate voltage of the GaN-FET device 141 increases from "−1.1875 V" to "−1.15 V".

In this way, the gate voltage determination unit 345 increases the gate voltage of the GaN-FET device 141 with an increase in the value of the distortion compensation coefficient. Since, in response to this, the Idq increases, and the amount of heat generation in the GaN-FET device 141 increases, it may be possible to resolve the change in the gain of the GaN-FET device, which occurs owing to the Idq drift.

Figure 12:
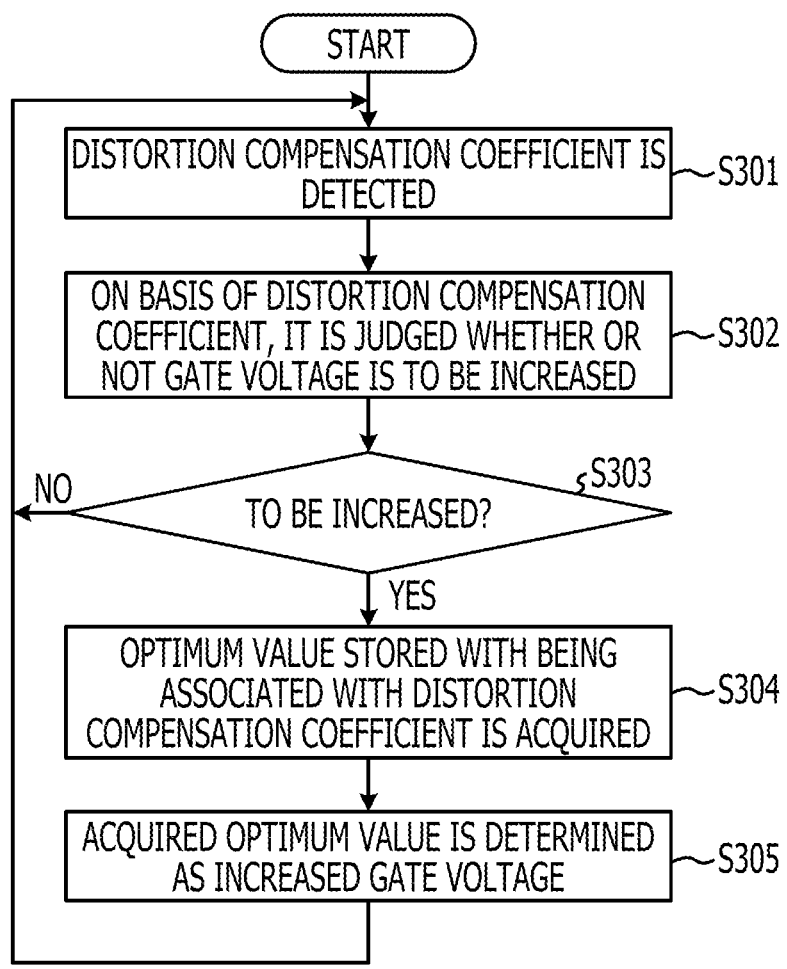
FIG. 12 is a flowchart illustrating a processing procedure of gate voltage determination processing performed by an amplifier according to the third embodiment.

Next, the processing procedure of gate voltage determination processing will be described that is performed by the amplifier 340 according to the third embodiment. FIG. 12 is a flowchart illustrating the processing procedure of the gate voltage determination processing performed by the amplifier 340 according to the third embodiment. As illustrated in FIG. 12, the distortion compensation coefficient detection unit 342 in the amplifier 340 detects the distortion compensation coefficient (Step S301).

Based on the distortion compensation coefficient detected by the distortion compensation coefficient detection unit 342, the gate voltage increase judgment unit 343 judges whether or not the gate voltage of the GaN-FET device 141 is to be increased (Step S302). For example, when the value of the distortion compensation coefficient is greater than or equal to the threshold value, the gate voltage increase judgment unit 343 judges that the gate voltage of the GaN-FET device 141 is to be increased. On the other hand, when the value of the distortion compensation coefficient is less than the threshold value, the gate voltage increase judgment unit 343 judges that the gate voltage of the GaN-FET device 141 is not to be increased.

When the gate voltage of the GaN-FET device 141 is not to be increased (Step S303: negative), the gate voltage increase judgment unit 343 returns the processing to Step S301. On the other hand, when the gate voltage increase judgment unit 343 judges that the gate voltage of the GaN-FET device 141 is to be increased (Step S303: affirmative), the gate voltage determination unit 345 refers to the optimum value storage 344. In addition, the gate voltage determination unit 345 acquires, from the optimum value storage 344, the optimum value corresponding to the value of the distortion compensation coefficient detected by the distortion compensation coefficient detection unit 342 (Step S304), determines the acquired optimum value as the increased gate voltage (Step S305), and returns the processing to Step S301.

As described above, the transmission apparatus 300 according to the third embodiment detects the distortion compensation coefficient as a given value used for monitoring a change in the gain of the GaN-FET device, and judges whether or not the value of the detected distortion compensation coefficient is greater than or equal to the threshold value. In addition, when the value of the distortion compensation coefficient is greater than or equal to the threshold value, the transmission apparatus 300 determines the increased gate voltage of the GaN-FET device in response to the value of the distortion compensation coefficient. Therefore, it may be possible for the transmission apparatus 300 to increase the gate voltage of the GaN-FET device at the time of a low temperature or at the time of a low output, at which the Idq measurably occurs, and it may be possible for the transmission apparatus 300 to increase the amount of heat generation in the GaN-FET device by increasing the Idq. As a result, it may be possible for the transmission apparatus 300 to resolve the change in the gain of the GaN-FET device, which occurs owing to the Idq drift.

In addition, by referring to the optimum value storage 344 storing therein the value of the distortion compensation coefficient and the optimum value of the gate voltage with the value of the distortion compensation coefficient and the optimum value of the gate voltage being associated with each other, the transmission apparatus 300 according to the third embodiment determines the optimum value corresponding to the value of the distortion compensation coefficient, as the increased gate voltage of the GaN-FET device. Therefore, since, compared with a method in which a gate voltage is dynamically adjusted in response to the value of the distortion compensation coefficient, it may be possible for the transmission apparatus 300 to shorten a time taken for searching the optimum value of the gate voltage, it may be possible to swiftly increase the gate voltage of the GaN-FET device at the time of a low temperature or at the time of a low output. As a result, it may be possible for the transmission apparatus 300 to effectively resolve the change in the gain of the GaN-FET device, which occurs owing to the Idq drift.

[Fourth Embodiment]

In the first, second, or third embodiment, a configuration has been described in which one of a temperature, input power, and a distortion compensation coefficient is detected as a given value used for monitoring a change in the gain of the GaN-FET device. However, all of the temperature, the input power, and the distortion compensation coefficient may also be used as given values used for monitoring a change in the gain of the GaN-FET device. Therefore, in a fourth embodiment, a case will be described in which all of the temperature, the input power, and the distortion compensation coefficient are detected as given values used for monitoring a change in the gain of the GaN-FET device.

Figure 13:
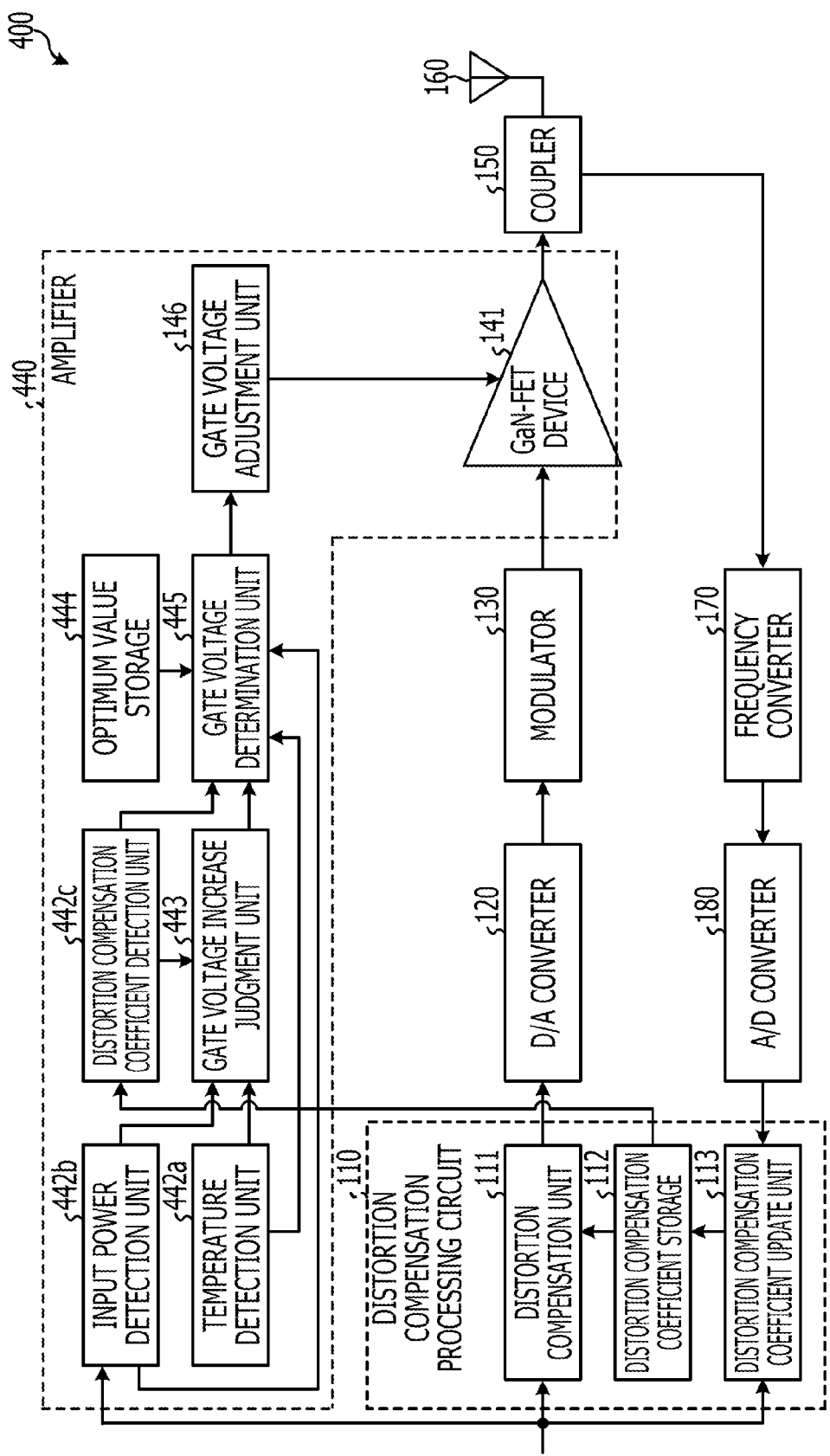
FIG. 13 is a diagram illustrating a configuration of a transmission apparatus according to a fourth embodiment.

FIG. 13 is a diagram illustrating the configuration of a transmission apparatus 400 according to the fourth embodiment. In addition, hereinafter, the same symbol will be assigned to the same configuration as in the first embodiment described above in FIG. 3, and the description thereof will be omitted. As illustrated in FIG. 13, the transmission apparatus 400 includes the distortion compensation processing circuit 110, the D/A converter 120, the modulator 130, an amplifier 440, the coupler 150, the antenna 160, the frequency converter 170, and the A/D converter 180.

The amplifier 440 amplifies the signal input from the modulator 130, using the GaN-FET device, and outputs the amplified signal to the coupler 150. In addition, the amplifier 440 detects a temperature, input power, and a distortion compensation coefficient so as to monitor a change in the gain of the GaN-FET device, and causes the gate voltage of the GaN-FET device to be increased based on the detected temperature, input power, and distortion compensation coefficient, thereby increasing the Idq.

The amplifier 440 includes the GaN-FET device 141, a temperature detection unit 442a, an input power detection unit 442b, a distortion compensation coefficient detection unit 442c, a gate voltage increase judgment unit 443, an optimum value storage 444, a gate voltage determination unit 445, and the gate voltage adjustment unit 146.

The temperature detection unit 442a detects the temperature of the transmission apparatus 400, as one of given values used for monitoring a change in the gain of the GaN-FET device 141, and outputs the value of the detected temperature, to the gate voltage increase judgment unit 443 and the gate voltage determination unit 445.

The input power detection unit 442b detects the input power of the transmission apparatus 400, as one of given values used for monitoring a change in the gain of the GaN-FET device 141, and outputs the value of the detected input power, to the gate voltage increase judgment unit 443 and the gate voltage determination unit 445.

The distortion compensation coefficient detection unit 442c detects the distortion compensation coefficient, as one of given values used for monitoring a change in the gain of the GaN-FET device 141, and outputs the value of the detected distortion compensation coefficient, to the gate voltage increase judgment unit 443 and the gate voltage determination unit 445. Specifically, by acquiring a corresponding distortion compensation coefficient from the distortion compensation coefficient storage 112 in the distortion compensation processing circuit 110, the distortion compensation coefficient detection unit 442c detects the distortion compensation coefficient. The distortion compensation coefficient is a correction value used for maintaining the linearity of the gain of the GaN-FET device 141, and is a value obtained by inverting the gain of the GaN-FET device 141. Namely, when the gain of the GaN-FET device 141 decreases, the distortion compensation coefficient inversely increases. In addition, hereinafter, it is assumed that the temperature detection unit 442a, the input power detection unit 442b, and the distortion compensation coefficient detection unit 442c will be collectively referred to as a "detection unit 442" in some cases.

The gate voltage increase judgment unit 443 acquires the values of a temperature, input power, and a distortion compensation coefficient from the detection unit 442, and, based on the acquired values of the temperature, the input power, and the distortion compensation coefficient, judges whether or not the gate voltage of the GaN-FET device 141 is to be increased. For example, when the value of one of the temperature and the input power is less than or equal to a threshold value, or when the value of the distortion compensation coefficient is greater than or equal to a threshold value, the gate voltage increase judgment unit 443 judges that the gate voltage of the GaN-FET device 141 is to be increased. On the other hand, when the value of one of the temperature and the input power exceeds a threshold value, or when the value of the distortion compensation coefficient is less than a threshold value, the gate voltage increase judgment unit 443 judges that the gate voltage of the GaN-FET device 141 is not to be increased. In addition, the gate voltage increase judgment unit 443 outputs a judgment result to the gate voltage determination unit 445.

The optimum value storage 444 stores therein the values of the temperature, the input power, and the distortion compensation coefficient and the optimum value of the gate voltage of the GaN-FET device 141 with the values of the temperature, the input power, and the distortion compensation coefficient and the optimum value of the gate voltage of the GaN-FET device 141 being associated with another other. For example, the optimum value storage 444 includes the optimum value storage 144 illustrated in FIG. 4, the optimum value storage 244 illustrated in FIG. 7, and the optimum value storage 344 illustrated in FIG. 11.

The gate voltage determination unit 445 acquires the judgment result from the gate voltage increase judgment unit 443, and acquires the values of a temperature, input power, and a distortion compensation coefficient from the detection unit 442. In response to the judgment result, the gate voltage determination unit 445 outputs the value of the increased gate voltage of the GaN-FET device 141 to the gate voltage adjustment unit 146.

When having acquired the judgment result indicating that the value of the temperature is less than or equal to the threshold value and the gate voltage is to be increased, the gate voltage determination unit 445 acquires the optimum value corresponding to the value of the temperature, by referring to the optimum value storage 444, and determines the acquired optimum value as the increased gate voltage. In addition, when having acquired the judgment result indicating that the value of the input power is less than or equal to the threshold value and the gate voltage is to be increased, the gate voltage determination unit 445 acquires the optimum value corresponding to the value of the input power, by referring to the optimum value storage 444, and determines the acquired optimum value as the increased gate voltage. In addition, when having acquired the judgment result indicating that the value of the distortion compensation coefficient is greater than or equal to the threshold value and the gate voltage is to be increased, the gate voltage determination unit 445 acquires the optimum value corresponding to the value of the distortion compensation coefficient, by referring to the optimum value storage 444, and determines the acquired optimum value as the increased gate voltage. In addition, the gate voltage determination unit 445 outputs, to the gate voltage adjustment unit 146, the determined value of the increased gate voltage. On the other hand, when having acquired the judgment result indicating that the gate voltage is not to be increased, the gate voltage determination unit 445 does not output the value of the gate voltage to the gate voltage adjustment unit 146.

Figure 14:
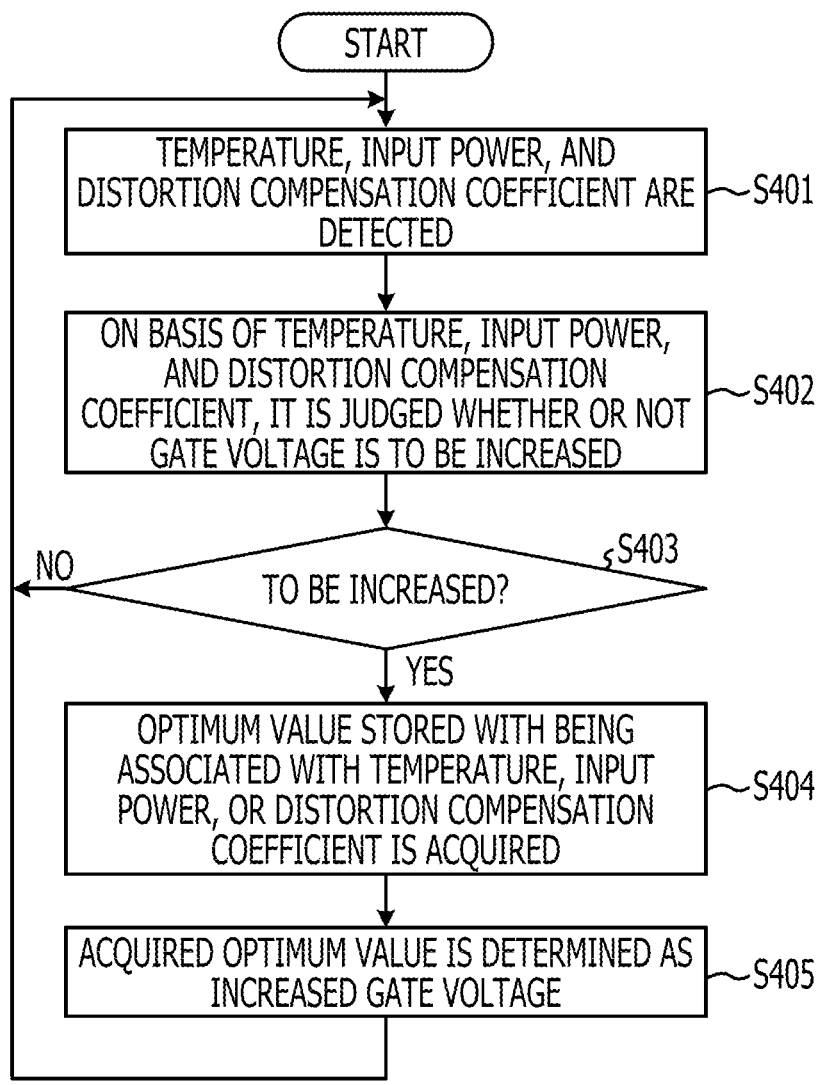
FIG. 14 is a flowchart illustrating a processing procedure of gate voltage determination processing performed by an amplifier according to the fourth embodiment.

Next, the processing procedure of gate voltage determination processing will be described that is performed by the amplifier 440 according to the fourth embodiment. FIG. 14 is a flowchart illustrating the processing procedure of the gate voltage determination processing performed by the amplifier 440 according to the fourth embodiment. As illustrated in FIG. 14, the detection unit 442 in the amplifier 440 detects the temperature, the input power, and the distortion compensation coefficient (Step S401).

Based on the temperature, the input power, and the distortion compensation coefficient, detected by the detection unit 442, the gate voltage increase judgment unit 443 judges whether or not the gate voltage of the GaN-FET device 141 is to be increased (Step S402). For example, when the value of one of the temperature and the input power is less than or equal to a threshold value, or when the value of the distortion compensation coefficient is greater than or equal to a threshold value, the gate voltage increase judgment unit 443 judges that the gate voltage of the GaN-FET device 141 is to be increased. On the other hand, when the value of one of the temperature and the input power exceeds the threshold value, or when the value of the distortion compensation coefficient is less than the threshold value, the gate voltage increase judgment unit 443 judges that the gate voltage of the GaN-FET device 141 is not to be increased.

When the gate voltage of the GaN-FET device 141 is not to be increased (Step S403: negative), the gate voltage increase judgment unit 443 returns the processing to Step S401. On the other hand, when the gate voltage increase judgment unit 443 judges that the gate voltage of the GaN-FET device 141 is to be increased (Step S403: affirmative), the gate voltage determination unit 445 refers to the optimum value storage 444. In addition, the gate voltage determination unit 445 acquires, from the optimum value storage 444, the optimum value corresponding to the value of the temperature, the input power, or the distortion compensation coefficient, detected by the detection unit 442 (Step S404), determines the acquired optimum value as the increased gate voltage (Step S405), and returns the processing to Step S401.

As described above, the transmission apparatus 400 according to the fourth embodiment detects the temperature, the input power, and the distortion compensation coefficient as given values used for monitoring a change in the gain of the GaN-FET device 141. In addition, the transmission apparatus 400 judges whether or not the value of one of the temperature and the input power is less than or equal to the threshold value or whether or not the distortion compensation coefficient is greater than or equal to the threshold value. In addition, when the value of one of the temperature and the input power is less than or equal to the threshold value, or when the value of the distortion compensation coefficient is greater than or equal to the threshold value, the transmission apparatus 400 determines the increased gate voltage of the GaN-FET device 141 in response to the value of the temperature, the input power, or the distortion compensation coefficient. Therefore, it may be possible for the transmission apparatus 400 to increase the gate voltage of the GaN-FET device 141 at the time of a low temperature or at the time of a low output, at which the Idq measurably occurs, and it may be possible for the transmission apparatus 400 to increase the amount of heat generation in the GaN-FET device 141 by increasing the Idq. As a result, it may be possible for the transmission apparatus 400 to resolve the change in the gain of the GaN-FET device 141, which occurs owing to the Idq drift.

In addition, by referring to the optimum value storage 444 storing therein the values of the temperature, the input power, and the distortion compensation coefficient and the optimum value of the gate voltage with the values of the temperature, the input power, and the distortion compensation coefficient and the optimum value of the gate voltage being associated with one other, the transmission apparatus 400 according to the fourth embodiment determines the optimum value corresponding to the value of the temperature, the input power, or the distortion compensation coefficient, as the increased gate voltage of the GaN-FET device 141. Therefore, since, compared with a method in which a gate voltage is dynamically adjusted in response to the value of the temperature, the input power, or the distortion compensation coefficient, it may be possible for the transmission apparatus 400 to shorten a time taken for searching the optimum value of the gate voltage, it may be possible to swiftly increase the gate voltage of the GaN-FET device 141 at the time of a low temperature or at the time of a low output. As a result, it may be possible for the transmission apparatus 400 to effectively resolve the change in the gain of the GaN-FET device 141, which occurs owing to the Idq drift.

In addition, while, in the present fourth embodiment, a case has been described in which all of the temperature, the input power, and the distortion compensation coefficient are detected as given values used for monitoring a change in the gain of the GaN-FET device, the disclosed technology is not limited to the case. For example, the temperature and the input power, the input power and the distortion compensation coefficient, or the distortion compensation coefficient and the temperature may also be detected as given values used for monitoring a change in the gain of the GaN-FET device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifier comprising:
a detector configured to detect a given value used for monitoring a change in a gain of an amplifying element amplifying a signal in response to a gate voltage applied to a gate terminal; and
a controller configured to judge, based on the detected given value, whether or not the gate voltage is to be increased, and to determine the increased gate voltage in response to the given value when the controller judges that the gate voltage is to be increased, wherein
the detector acquires a distortion compensation coefficient from a distortion compensation processing unit performing distortion compensation processing on the signal using the distortion compensation coefficient that is a value obtained by inverting the gain of the amplifying element, and detects the acquired distortion compensation coefficient as the given value.

2. The amplifier according to claim 1, wherein
the detector detects a temperature of the amplifier as the given value.

3. The amplifier according to claim 1, wherein
the detector detects power of the signal as the given value.

4. The amplifier according to claim 1, further comprising:
a storage configured to store the given value and an optimum value of the gate voltage with the given value and the optimum value of the gate voltage being associated with each other, wherein
when the controller judges that the gate voltage is to be increased, the controller acquires an optimum value corresponding to the given value, by referring to the storage, and determines the acquired optimum value as the increased gate voltage.

5. A transmission apparatus comprising:
a transmitter configured to transmit an amplified transmission signal;
a detector configured to detect a given value used for monitoring a change in a gain of an amplifying element amplifying the transmission signal in response to a gate voltage applied to a gate terminal;
a controller configured to judge, based on the detected given value, whether or not the gate voltage is to be increased, and to determine the increased gate voltage in response to the given value the controller judges that the gate voltage is to be increased; and
a distortion compensation processing unit configured to perform distortion compensation processing on the signal using a distortion compensation coefficient that is a value obtained by inverting the gain of the amplifying element; wherein the detector detects the distortion compensation coefficient as the given value.

6. The transmission apparatus according to claim 5, wherein
the detector detects a temperature of the transmission apparatus as the given value.

7. The amplifier according to claim 5, wherein
the detector detects power of the signal as the given value.

8. The transmission apparatus according to claim 5, further comprising:
a storage configured to store the given value and an optimum value of the gate voltage with the given value and the optimum value of the gate voltage being associated with each other, wherein
when the controller judges that the gate voltage is to be increased, the controller acquires an optimum value corresponding to the given value, by referring to the storage, and determines the acquired optimum value as the increased gate voltage.

9. A gate voltage determination method, comprising:
detecting a given value serving as a factor that changes a gain of an amplifying element amplifying a signal in response to a gate voltage applied to a gate terminal;
judging, based on the detected given value, whether or not the gate voltage is to be increased; and
determining the increased gate voltage in response to the given value when it is judged that the gate voltage is to be increased, wherein
the detecting acquires a distortion compensation coefficient, which is used for distortion compensation processing performed on the signal and is a value obtained by inverting the gain of the amplifying element, and detects the acquired distortion compensation coefficient as the given value.

10. The gate voltage determination method according to claim 9, wherein
the detecting detects a temperature of the amplifier as the given value.

11. The gate voltage determination method according to claim 9, wherein
the detecting detects power of the signal as the given value.

12. The gate voltage determination method according to claim 9, wherein
the given value and an optimum value of the gate voltage are stored in a storage with being associated with each other, and
when the judging judges that the gate voltage is to be increased, the determining acquires an optimum value corresponding to the given value, by referring to the storage, and determines the acquired optimum value as the increased gate voltage.

13. An amplifier comprising:
an amplifying element configured to amplify a signal in response to a gate voltage applied to a gate terminal;
a detection circuit configured to detect a value of a parameter used for monitoring a change in a gain of the amplifying element; and
a control circuit configured to determine the gate voltage based on the detected value of the parameter, wherein
the detection circuit acquires a distortion compensation coefficient from a distortion compensation processing circuit performing distortion compensation processing on the signal using a distortion compensation coefficient that is a value obtained by inverting the gain of the amplifying element, and detects the acquired distortion compensation coefficient as the value of the parameter.

14. The amplifier according to claim 13, wherein
the control circuit judges, based on the detected value of the parameter, whether or not the gate voltage is to be increased, and determines the increased gate voltage in response to the value of the parameter when the control circuit judges that the gate voltage is to be increased.

15. The amplifier according to claim 13, wherein
the detection circuit detects a temperature of the amplifier as the value of the parameter.

16. The amplifier according to claim 13, wherein
the detection circuit detects power of the signal as the value of the parameter.

17. The amplifier according to claim 13, further comprising:
a storage configured to store the value of the parameter and an optimum value of the gate voltage with the value of the parameter and the optimum value of the gate voltage being associated with each other, wherein
when the control circuit judges that the gate voltage is to be increased, the control circuit acquires an optimum value corresponding to the given value, by referring to the storage, and determines the acquired optimum value as the increased gate voltage.

* * * * *